(12) United States Patent
Peng et al.

(10) Patent No.: US 12,308,252 B2
(45) Date of Patent: May 20, 2025

(54) INTERPOSER, MANUFACTURING METHOD THEREFOR, AND CIRCUIT BOARD ASSEMBLY

(71) Applicants: QING DING PRECISION ELECTRONICS (HUAIAN) CO., LTD, Huai an (CN); Avary Holding (Shenzhen) Co., Limited., Shenzhen (CN)

(72) Inventors: Man-Zhi Peng, Huaian (CN); Rui-Wu Liu, Huaian (CN); Si Xiong, Shenzhen (CN); Lin-Jie Gao, Shenzhen (CN)

(73) Assignees: QING DING PRECISION ELECTRONICS (HUAIAN) CO., LTD, Huai an (CN); Avary Holding (Shenzhen) Co., Limited., Shenzhen (CN)

( * ) Notice: Subject to any disclaimer, the term of this patent is extended or adjusted under 35 U.S.C. 154(b) by 722 days.

(21) Appl. No.: 17/764,262

(22) PCT Filed: Sep. 27, 2019

(86) PCT No.: PCT/CN2019/108587
§ 371 (c)(1),
(2) Date: May 16, 2022

(87) PCT Pub. No.: WO2021/056427
PCT Pub. Date: Apr. 1, 2021

(65) Prior Publication Data
US 2022/0336230 A1    Oct. 20, 2022

(51) Int. Cl.
*H01L 21/48* (2006.01)
*H01L 23/00* (2006.01)
(Continued)

(52) U.S. Cl.
CPC ........ *H01L 21/4857* (2013.01); *H01L 21/486* (2013.01); *H01L 23/49822* (2013.01);
(Continued)

(58) Field of Classification Search
CPC . H01L 21/4857; H01L 23/49822; H05K 1/11; H05K 3/42
See application file for complete search history.

(56) References Cited

U.S. PATENT DOCUMENTS

2001/0042902 A1* 11/2001 Wakabayashi .......... H01L 24/12
257/E23.021
2002/0084538 A1* 7/2002 James .................... H01L 23/13
257/788
(Continued)

*Primary Examiner* — Mohsen Ahmadi
(74) *Attorney, Agent, or Firm* — ScienBiziP, P.C.

(57) ABSTRACT

An interposer, which is used to connect two circuit boards, includes an inner structure (10), an outer structure (20), and a protective layer (50). The inner structure (10) includes a first base layer (11) and a first wiring layer (131) formed on the first base layer (11). The outer structure (20) includes a second base layer (21) and a second wiring layer (231) formed on the second base layer (21). An end portion of at least wiring line of the first wiring layer (131) and the second wiring layer (231) extends to a sidewall of the interposer (100). An end of another wiring line extends to the other sidewall of the interposer (100). The first wiring layer (131) is electrically connected to the second wiring layer (231) by a conductive blind hole (41).

14 Claims, 13 Drawing Sheets

(51) Int. Cl.
*H01L 23/498* (2006.01)
*H05K 1/11* (2006.01)
*H05K 3/42* (2006.01)

(52) U.S. Cl.
CPC ........ *H01L 23/49827* (2013.01); *H01L 24/43* (2013.01); *H01L 2224/43125* (2013.01)

(56) References Cited

U.S. PATENT DOCUMENTS

| | | | | |
|---|---|---|---|---|
| 2002/0179331 | A1* | 12/2002 | Brodsky | H01R 12/523 174/262 |
| 2007/0018313 | A1* | 1/2007 | Gomyo | H01L 25/105 257/E21.503 |
| 2007/0289773 | A1* | 12/2007 | Caletka | H05K 1/0219 174/262 |
| 2010/0007005 | A1* | 1/2010 | Akimoto | H01L 24/49 257/691 |
| 2014/0056087 | A1* | 2/2014 | Kim | G11C 7/1087 365/194 |
| 2014/0291001 | A1* | 10/2014 | Lin | H01L 23/49833 29/852 |
| 2015/0235989 | A1* | 8/2015 | Yu | H01L 25/105 257/773 |
| 2016/0172354 | A1* | 6/2016 | Kaneko | H10D 30/6755 257/43 |
| 2016/0204056 | A1* | 7/2016 | Lin | H01L 21/6836 29/830 |
| 2020/0137894 | A1* | 4/2020 | Shen | H05K 3/4661 |
| 2022/0130752 | A1* | 4/2022 | Kim | H01L 23/49827 |

\* cited by examiner

INTERPOSER, MANUFACTURING METHOD THEREFOR, AND CIRCUIT BOARD ASSEMBLY

FIELD

The subject matter herein relates to an interposer, a manufacturing method of the interposer, and a circuit board assembly.

BACKGROUND

At present, an interposer is used to connect two circuit boards together. The interposer is located between the two circuit boards. The interposer electrically connects the two circuit boards to each other by connecting pads on opposite surfaces of a substrate, and the connecting pads are formed by mechanically drilling holes in the substrate and metalizing the holes by plating. However, due to limitations of the thickness of the interposer and a mechanical drilling needle, to meet the requirement of fine pitch equal to or less than 0.635 mm (25 mil), the penetration ability of a plating solution is required to be high. A breaking rate of the needle of the drilling equipment is also high, resulting in increase of cost.

SUMMARY

To overcome the above shortcomings, an interposer, a manufacturing method of the interposer, and a circuit board assembly are needed.

An interposer includes a first sidewall and a second sidewall opposite to the first sidewall, the interposer further includes: an inner structure including a first base layer and a first wiring layer formed on the first base layer; at least one outer structure each including a second base layer and a second wiring layer formed on the second base layer, wherein wiring lines of the first wiring layer or the second wiring layer includes a first wiring line, an end portion of the first wiring line extends to the first sidewall, the wiring lines of the first wiring layer or the second wiring layer further includes a second wiring line, an end portion of the second wiring line extends to the second sidewall, the end portion of the first wiring line or the second wiring line extending to the corresponding first or second sidewall functions as a connecting pad; an adhesive layer bonding the second base layer on the first wiring layer; at least one conductive blind hole at least passing through the adhesive layer and the second base layer, wherein an end portion of the at least one conductive blind hole is connected to another end portion of the first wiring line that does not extend to the first sidewall, and another end portion of the at least one conductive blind hole is connected to another end portion of the second wiring line that does not extend to the second sidewall, thereby forming a path from one side of the interposer to the other side; and a protective layer covering the second wiring layer.

Furthermore, the wiring lines of the first wiring layer or the second wiring layer further include a third wiring line, two end portions of the third wiring line extend to the first sidewall and the second sidewall, respectively.

Furthermore, the wiring lines of the first wiring layer or the second wiring layer further include a fourth wiring line, two end portions of the fourth wiring line do not extend to the first sidewall and the second sidewall.

Furthermore, a spacing between adjacent two of the wiring lines of the first wiring layer is greater than 0.25 mm and less than or equal to 0.635 mm, and a spacing between adjacent two of the wiring lines of the second wiring layer is greater than 0.25 mm and less than or equal to 0.635 mm.

Furthermore, each of the first base layer and the second base layer is made of a material selected from a group consisting of polyimide, polypropylene, liquid crystal polymer, polyether-ether-ketone, polyethylene terephthalate, and polyethylene naphthalate.

Furthermore, the interposer further includes a reinforcing plate covering the protective layer.

Furthermore, a thickness of the first base layer is greater than a thickness of the second base layer.

Furthermore, the first wiring layer is formed on each of two opposite surfaces of the first base layer, the at least one outer structure includes at least two outer structures, each of the at least two outer structures covers the first wiring layer.

A manufacturing method of an i interposer includes following steps:

forming a first wiring layer on a first base layer;
pressing a second base layer on the first wiring layer through an adhesive layer;
forming a second wiring layer on a surface of the second base layer away from the first wiring layer;
defining a blind hole, wherein the blind hole passes through the second wiring layer, the second base layer, the adhesive layer, the first wiring layer, and the first base layer;
electroplating in the blind hole to form a conductive blind hole:
covering a protective layer on the second wiring layer to obtain the interposer, wherein the interposer includes a first sidewall and a second sidewall opposite to the first sidewall; wiring lines of the first wiring layer or the second wiring layer include a first wiring line, an end portion of the first wiring line extends to the first sidewall, an end portion of the conductive blind hole is connected to another end portion of the first wiring line that does not extend to the first sidewall; the wiring lines of the first wiring layer or the second wiring layer further include a second wiring line, an end portion of the second wiring line extends to the second sidewall, another end portion of the conductive blind hole is connected to another end portion of the second wiring line that does not extend to the second sidewall.

Furthermore, the wiring lines of the first wiring layer or the second wiring layer further include a third wiring line, two end portions of the third wiring line extend to the first sidewall and the second sidewall, respectively.

Furthermore, the wiring lines of the first wiring layer or the second wiring layer further include a fourth wiring line, two end portions of the fourth wiring line do not extend to the first sidewall and the second sidewall.

Furthermore, the method further includes a step of covering a reinforcing plate on the protective layer.

A circuit board assembly includes two circuit boards and an interposer disposed between the two circuit boards. The interposer includes a first sidewall and a second sidewall opposite to the first sidewall. The interposer includes a plurality of base layers and wiring lines disposed between adjacent two of the plurality of base layers; the interposer further includes a conductive blind hole for connecting two of the wiring lines at different layers; an end portion of one of the two wiring lines is connected to one of the two circuit boards, and an end portion of the other one of the two wiring lines is connected to the other one of the two circuit boards.

The manufacturing method of the interposer of the present disclosure is simple. The interposer with a lead pitch equal to or less than 0.635 mm can be obtained by a circuit board manufacturing process, and the manufacturing cost is low. The conductive blind holes of the interposer of the present disclosure can flexibly connect the two circuit boards to each other.

SYMBOL DESCRIPTION OF MAIN COMPONENT

Figure 1:
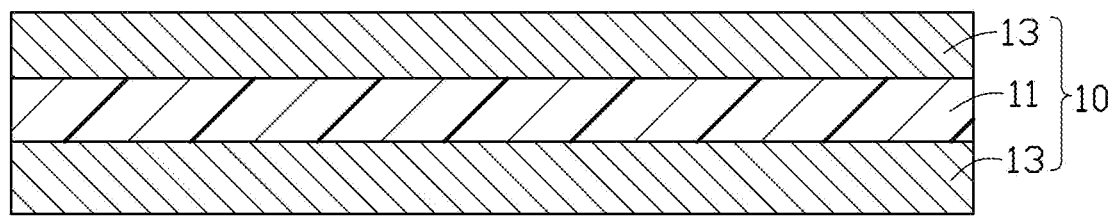
FIG. 1 is a cross-sectional view of an inner structure of an interposer according to an embodiment of the present disclosure.

Interposer 100; inner structure 10; first base layer 11; first copper layer 13; first wiring layer 131; outer structure 20; second base layer 21; second copper layer 23; second wiring layer 231; wiring line 1311, 2311; adhesive layer 30; blind hole 40; conductive blind hole 41; protective layer 50; cutting line 51; reinforcing plate 60; sidewall 101, 102; circuit board assembly 200; circuit board, 201a, 201b.

Implementations of the present technology will now be described, by way of embodiments, with reference to the attached figures.

DETAILED DESCRIPTION

Implementations of the disclosure will now be described, by way of embodiments only, with reference to the drawings. The disclosure is illustrative only, and changes may be made in the detail within the principles of the present disclosure. It will, therefore, be appreciated that the embodiments may be modified within the scope of the claims.

It should be noted that when an element is considered to be "fixed to" another element, it can be directly fixed on another element or there may be an intermediate element. When an element is considered to be "connected" to another element, it can be directly connected to another element or there may be an intermediate element. When an element is considered to be "set on" another element, it can be set directly on another element or there may be an intermediate element.

Unless otherwise defined, all technical terms used herein have the same meaning as commonly understood by one of ordinary skill in the art. The technical terms used herein are for describing specific embodiments but not to be considered as limiting the scope of the embodiments. The term "and/or" as used herein includes any and all combinations of one or more related listed items.

Referring to FIGS. 1 to 10, a manufacturing method of an interposer 100 is provided according to an embodiment of the present disclosure. The manufacturing method includes the following steps.

In step 1, referring to FIG. 1, an inner structure 10 is provided. The inner structure includes a first base layer 11 and two first copper layers 13 formed on two opposite surfaces of the first base layer 11.

The first base layer 11 may be made of a material selected from a group consisting of polyimide (PI), polypropylene (PI), liquid crystal polymer (LCP), polyether-ether-ketone (PEEK), polyethylene terephthalate (PET), and polyethylene phthalate (PEN).

In the embodiment, the inner structure 10 includes the two first copper layers 13, which is not limited. In other embodiments, the inner structure 10 may include only one first copper layer 13 formed on the first base layer 11.

Figure 2:
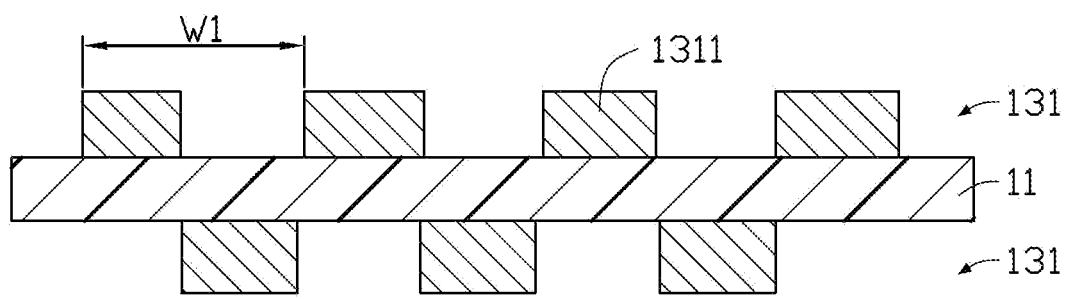
FIG. 2 is a cross-sectional view showing the inner structure of FIG. 1 being etched.

In step 2, referring to FIG. 2, each first copper layer 13 is subjected to processes of dry film pressing, exposure, development, etching, and developing etching stripping (DES) to form a first wiring layer 131. A spacing W1 between two adjacent wiring lines 1311 of the first wiring layer 131 is in a range of 0.25 mm to 0.635 mm.

Figure 3:
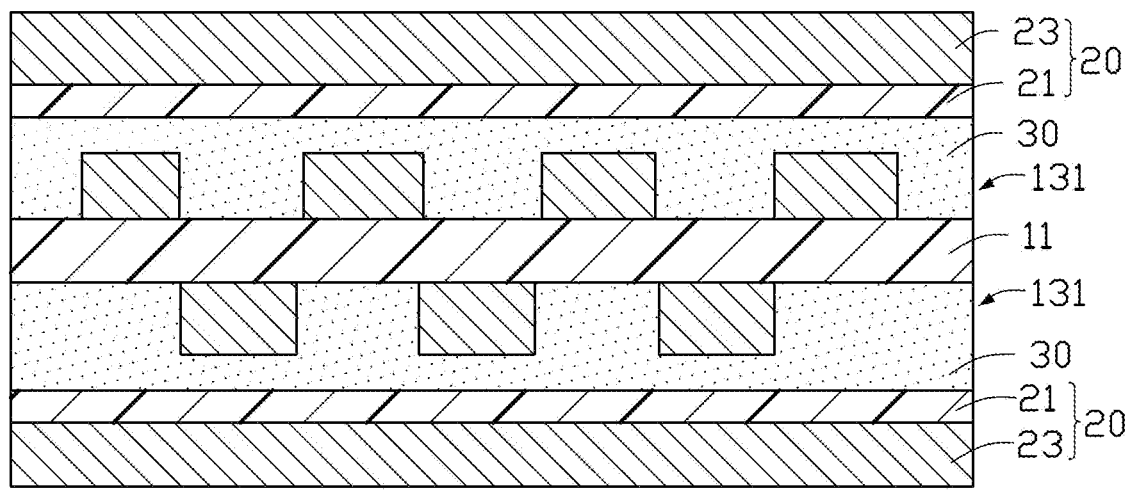
FIG. 3 is a cross-sectional view showing an outer structure pressed onto the inner structure of FIG. 2.

In step 3, referring to FIG. 3, an outer structure 20 and an adhesive layer 30 are provided. The outer structure 20 includes a second base layer 21 and a second copper layer 23 formed on the second base layer 21. The second base layer 21 is pressed onto each first wiring layer 131 through the adhesive layer 30.

It can be understood that the number of the outer structures 20 is not limited to two. In other embodiments, the number of the outer structures 20 may be set according to actual needs, and the outer structures 20 are pressed in turn onto each first wiring layer 131.

The second base layer 21 may be made of a material selected from a group consisting of polyimide (PI), polypropylene (PP), liquid crystal polymer (LCP), polyether-ether-ketone (PEEK), polyethylene terephthalate (PET), and polyethylene phthalate (PEN). It can be understood that the material of the second base layer 21 may be selected according to whether the outer structure 20 is a rigid board or a flexible-rigid board. A thickness of the first base layer 11 is greater than a thickness of the second base layer 21.

Figure 4:
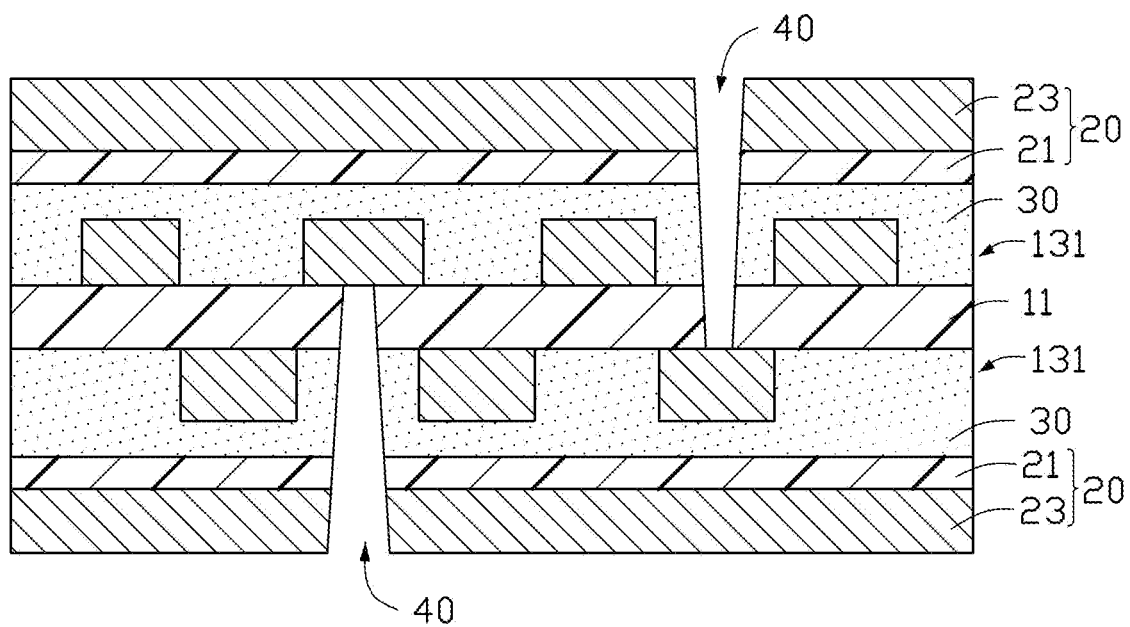
FIG. 4 is a cross-sectional view showing a blind hole defined in the structure of FIG. 3.

In step 4, a hole forming process is shown in FIG. 4. At least one blind hole 40 is defined along a stacking direction of the second copper layer 23, the second base layer 21, the adhesive layer 30, the first wiring layer 131, and the first base layer 11. The blind hole 40 penetrates one second copper layer 23, the corresponding second base layer 21, the corresponding adhesive layer 30, the corresponding first wiring layer 131, and the first base layer 11, and another first wiring layer 131 closes an end portion of the blind hole 40.

In some embodiments, the blind hole 40 may also penetrate only the second copper layer 23, the second base layer 21, and the adhesive layer 30. It can be understood that the blind hole 40 may be also defined between two wiring layers in the interposer 100 that need to be electrically connected to each other.

Figure 5:
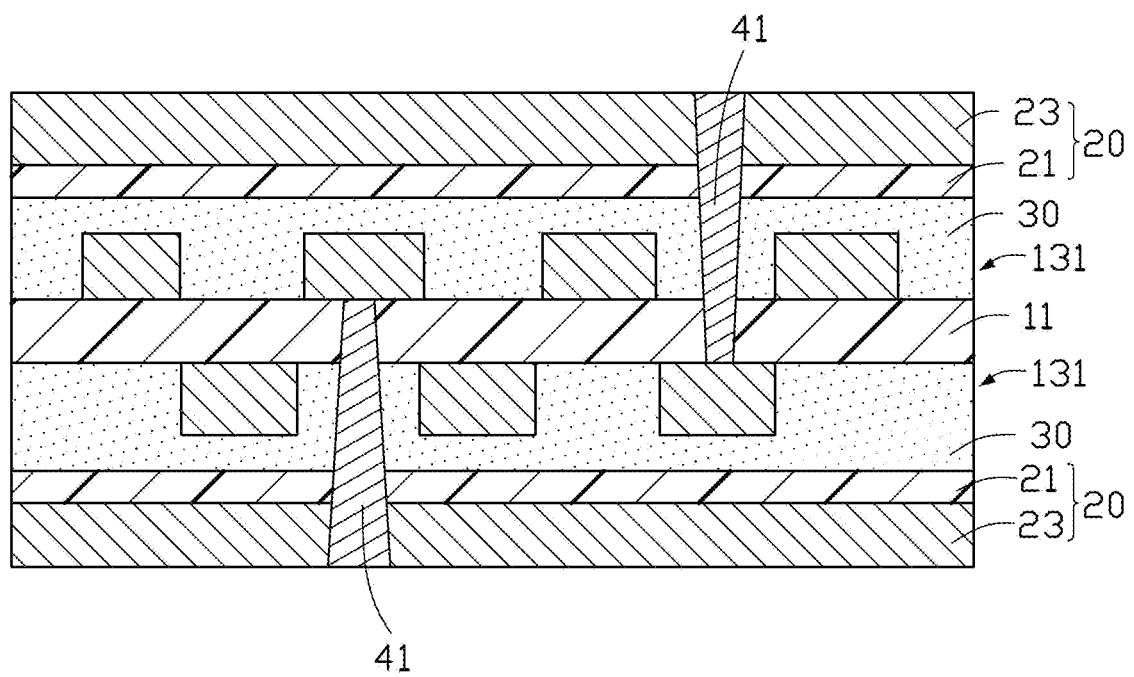
FIG. 5 is a cross-sectional view showing the blind hole of FIG. 4 being filled.

In step 5, a hole filling process is shown in FIG. 5. The blind hole 40 is electroplated to form a conductive blind hole 41 that electrically connects the second copper layer 23 to the first wiring layer 131.

Figure 6:
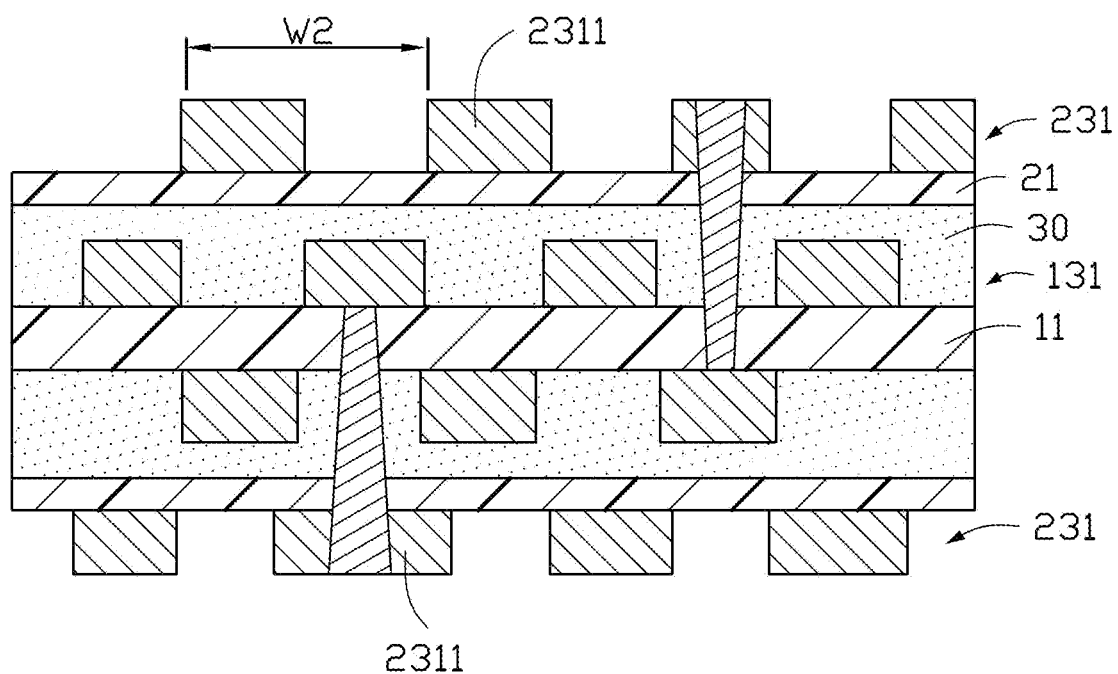
FIG. 6 is a cross-sectional view showing the outer structure of FIG. 5 being etched.

In step 6, referring to FIG. 6, each second copper layer 23 is subjected to processes of dry film pressing, exposure, development, and developing etching stripping (DES) to form a second wiring layer 231. A spacing W2 between two adjacent wiring lines 2311 of the second wiring layer 231 is in a range of 0.25 mm to 0.635 mm.

Figure 7:
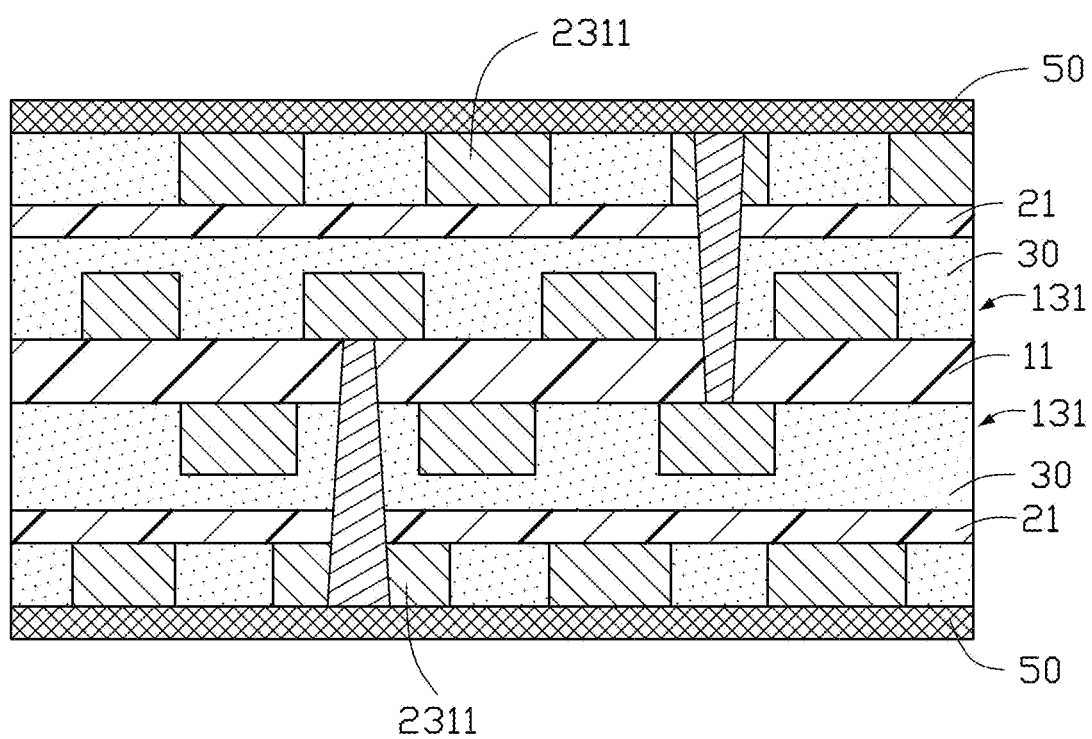
FIG. 7 is a cross-sectional view showing a protective layer covering on the structure of FIG. 6.

In step 7, referring to FIG. 7, a protective layer 50 covers on each second wiring layer 231 to obtain an intermediate master board.

The protective layer 50 can be a common solder mask layer or a cover layer (CVL).

Figure 8:
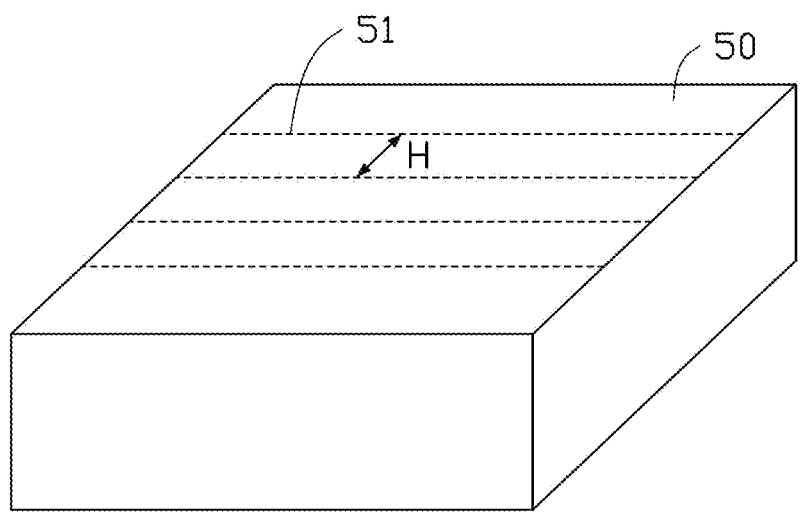
FIG. 8 is a diagrammatic view showing the structure of FIG. 7 being cut.

In step 8, a cutting process is shown in FIG. 8. The intermediate master board is cut along cutting lines 51 and in a stacking direction of the protective layer 50, the outer structure 20, and the inner structure 10 to form the interposer 100.

In this step, some wiring lines are exposed from sidewalls of the interposer 100. An end portion of any wiring line exposed from the sidewall can be functioned as a connecting pad, which can be used to electrically connect to a corresponding circuit board.

A distance H between two cutting lines 51 is designed to be equal to a required height of the interposer 100.

It can be understood that in this step, the intermediate master board is cut to form a plurality of interposers 100. When only a single interposer 100 is formed after steps 1 to 7, the cutting process can be omitted.

Figure 9:
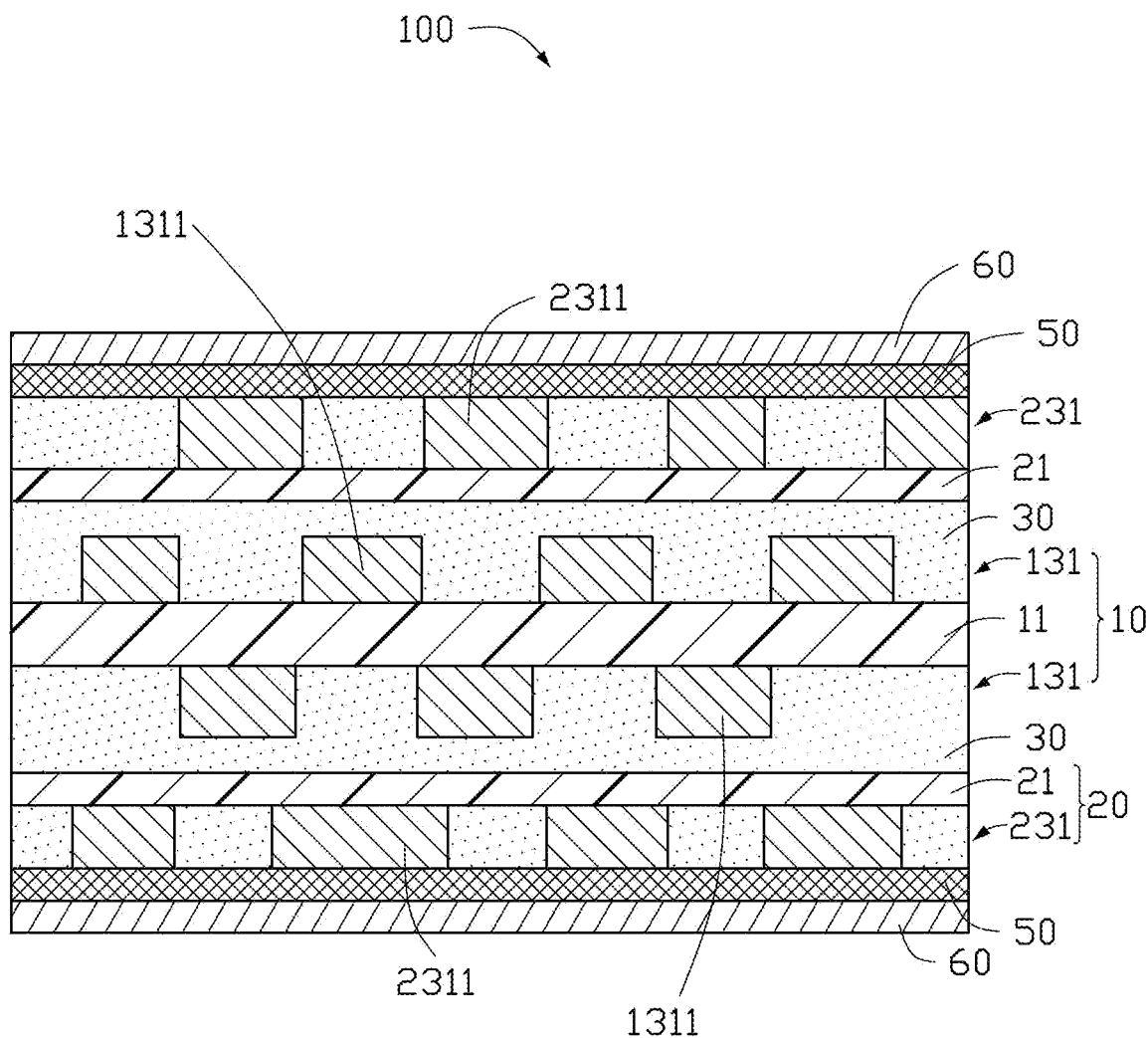
FIG. 9 is a left-side view showing a reinforcing plate covering on the structure of FIG. 8 to obtain the interposer.
Figure 10:
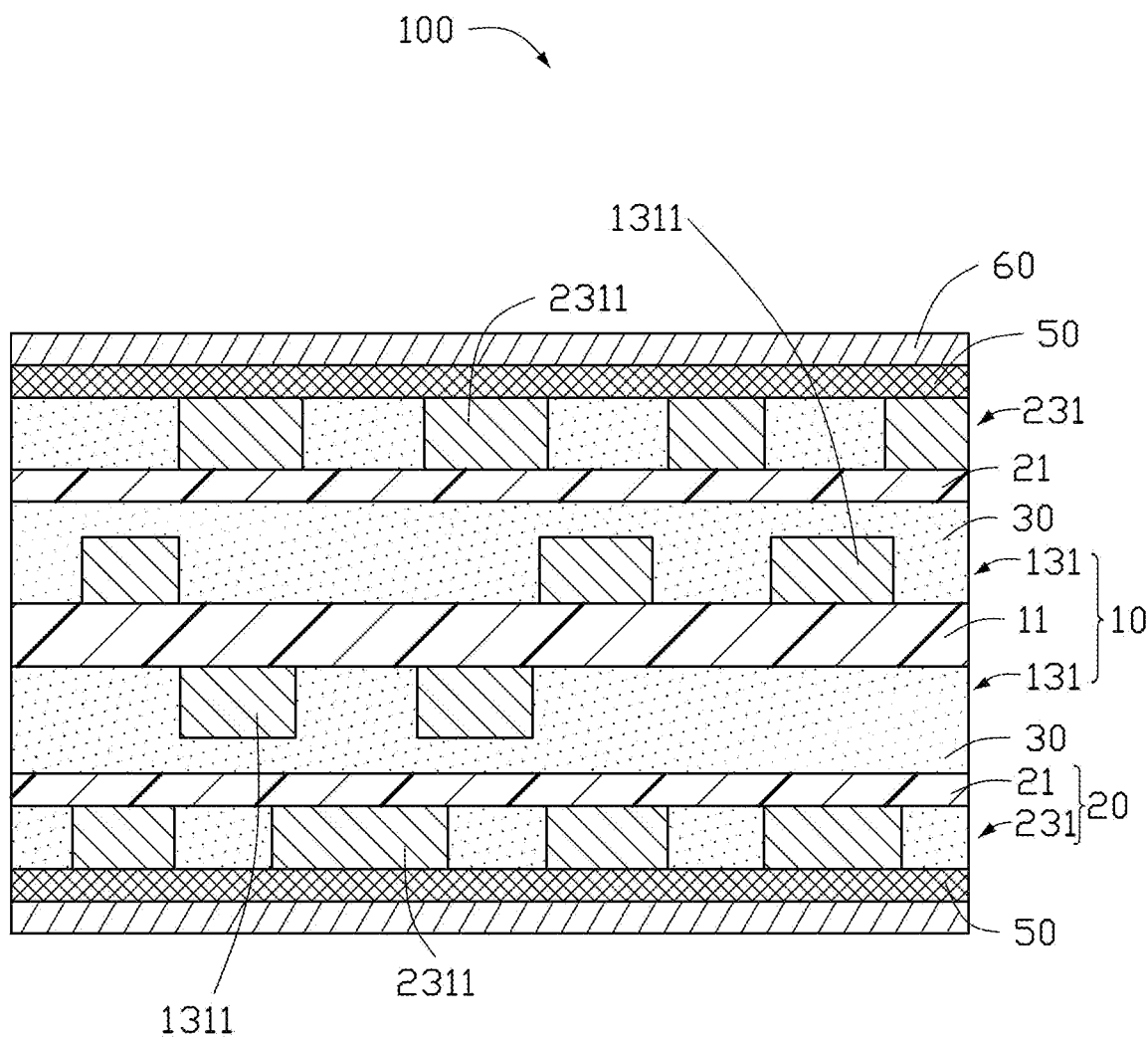
FIG. 10 is a right-side view of the interposer of FIG. 9.

Referring to FIGS. 9 and 10, FIG. 9 is a left-side view of the interposer 100, and FIG. is a right-side view of the interposer 100. The wiring lines 1311 of the first wiring layer 131 and the wiring lines 2311 of the second wiring layer 231 are functioned as conductive structures for connecting two circuit boards, and the wiring lines 1311 and the wiring lines 2311 may be asymmetric with respect to each other. That is, positions of the wiring lines 1311 of the first wiring layer 131 and the wiring lines 2311 of the second wiring layer 231 in FIGS. 9 and 10 are not aligned with each other. It can be understood that the positions of the wiring lines 1311 of the first wiring layer 131 and the wiring lines 2311 of the second wiring layer 231 are designed according to the actual conduction positions required by the two circuit boards.

Figure 11:
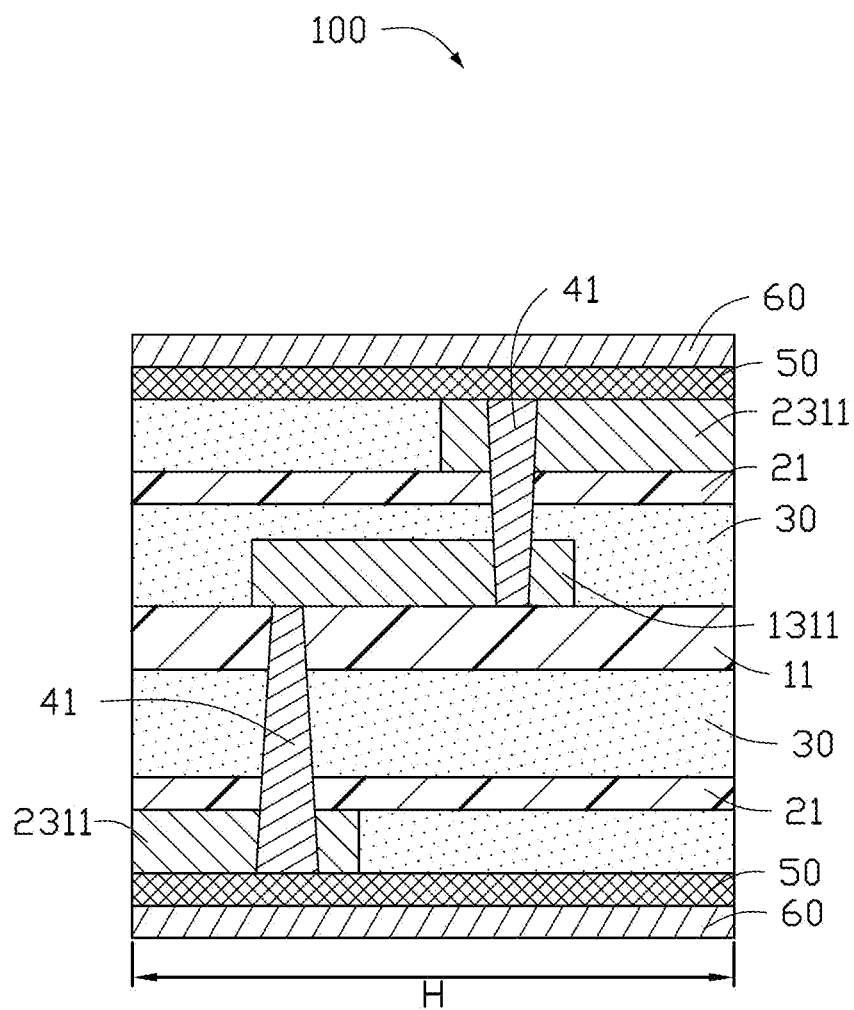
FIG. 11 is a cross-sectional view of a region of the interposer of FIG. 10.

In step 9, referring to FIG. 11, a reinforcing plate 60 covers on each protective layer 50.

The reinforcing plate 60 may be made of a material selected from a group consisting of polyimide (PI), aluminum, copper, etc., which can provide a shielding and supporting function.

It is understood that this step may be omitted in some embodiments.

The manufacturing method of the interposer 100 of the present disclosure is simple. The interposer 100 with a lead pitch equal to or less than 0.635 mm can be obtained by a circuit board manufacturing process, and the manufacturing cost is low. The asymmetric structure and the conductive blind holes of the interposer 100 of the present disclosure can flexibly connect the two circuit boards to each other.

Referring to FIGS. 9 to 11, an interposer 100 for connecting at least two circuit boards is provided according to an embodiment of the present disclosure. The interposer 100 includes an inner structure 10, an outer structure 20, a protective layer 50, and a reinforcing plate 60 stacked in that order. The inner structure 10 is electrically connected to the outer structure 20.

The inner structure 10 includes a first base layer 11 and a first wiring layer 131 formed on the first base layer 11. The spacing W1 between two adjacent wiring lines 1311 of the first wiring layer 131 meets the following condition of 0.25 mm≤W1≤0.635 mm. In some embodiments, the inner structure 10 is a single-sided board. That is, only one first wiring layer 131 is formed on the first base layer 11. In other embodiments, the inner structure 10 is a double-sided board. That is, two first wiring layers 131 are formed on two opposite surfaces of the first base layer 11.

The outer structure 20 includes a second base layer 21 and a second wiring layer 231 formed on the second base layer 21. The spacing W2 between two adjacent wiring lines 2311 of the second wiring layer 231 meets the following condition of 0.25 mm≤W2≤0.635 mm. The interposer 100 also includes an adhesive layer 30. The second base layer 21 is bonded to the first wiring layer 131 through the adhesive layer 30.

An end portion of at least one wiring line of the first wiring layer 131 and the second wiring layer 231 extends to the sidewall of the interposer 100, and an end portion of another wiring line extends to another sidewall of the interposer 100. Specifically, all of the wiring lines of the first wiring layer 131 and the second wiring layer 231 include following four cases. The first case is that both end portions of the wiring line extend to two opposite sidewalls of the interposer 100, and such wiring line is referred to as a third wiring line. The second case is that only one end portion of the wiring line extends to one sidewall of the interposer 100, and such wiring line is referred to as a first wiring line. The third case is that only one end portion of the wiring line extends to another sidewall of the interposer 100, and such wiring line is referred to as a second wiring line. The fourth case is that both end portions of the wiring line do not extend to the sidewalls of the interposer 100, and such wiring line is referred to as a fourth wiring line. The end portion of any wiring line extending to the sidewall is used as the connecting pad for connecting the corresponding circuit board.

Each of the first base layer 11 and the second base layer 21 may be selected from a group consisting of polyimide (PI), polypropylene (PI), liquid crystal polymer (LCP), polyether-ether-ketone (PEEK), polyethylene terephthalate (PET), and polyethylene phthalate (PEN).

Referring to FIGS. 9 and 10, FIG. 9 is the left-side view of the interposer 100, and FIG. 10 is the right-side view of the interposer 100. The wiring lines 1311 of the first wiring layer 131 and the wiring lines 2311 of the second wiring layer 231 are conductive structures for connecting the two circuit boards. The wiring lines 1311 and the wiring lines 2311 may be asymmetric with respect to each other. Specifically, the wiring lines that extends to the sidewalls of the interposer 100 are not aligned with each other.

Referring to FIG. 11, the interposer 100 also includes at least one conductive blind hole 41. One of the conductive blind hole 41 passes through one second wiring layer 231, the corresponding second base layer 21, the corresponding adhesive layer 30, the first wiring layer 131, and the first base layer 11, and another first wiring layer 131 closes an end portion of the conductive blind hole 41. Thus, the first wiring layer 131 is electrically connected to the second wiring layer 231. In this embodiment, one end portion of the conductive blind hole 41 is connected to one end portion of the wiring line 2311 of the second wiring layer 231 that does not extend to the sidewall of the interposer 100. The other end portion of the conductive blind hole 41 is connected to one end portion of the wiring line 1311 of the first wiring layer 131 that does not extend to the sidewall of the interposer 100. Thus, the conductive blind hole 41 electrically connects the wiring line 1311 to the wiring line 2311, and forms a path from one side of the interposer 100 to the other side to connect the two circuit boards. In other embodiments, the end portions of the conductive blind hole 41 may also be connected to the end portions of two wiring lines 2311 of two second wiring layers 231 that do not extend to the sidewalls of the interposer 100. It can be understood that the conductive blind hole 41 is used as a conducting structure between layers in the interposer 100, which forms a path from one side of the interposer 100 to the other side to connect the two circuit boards together.

Figure 12:
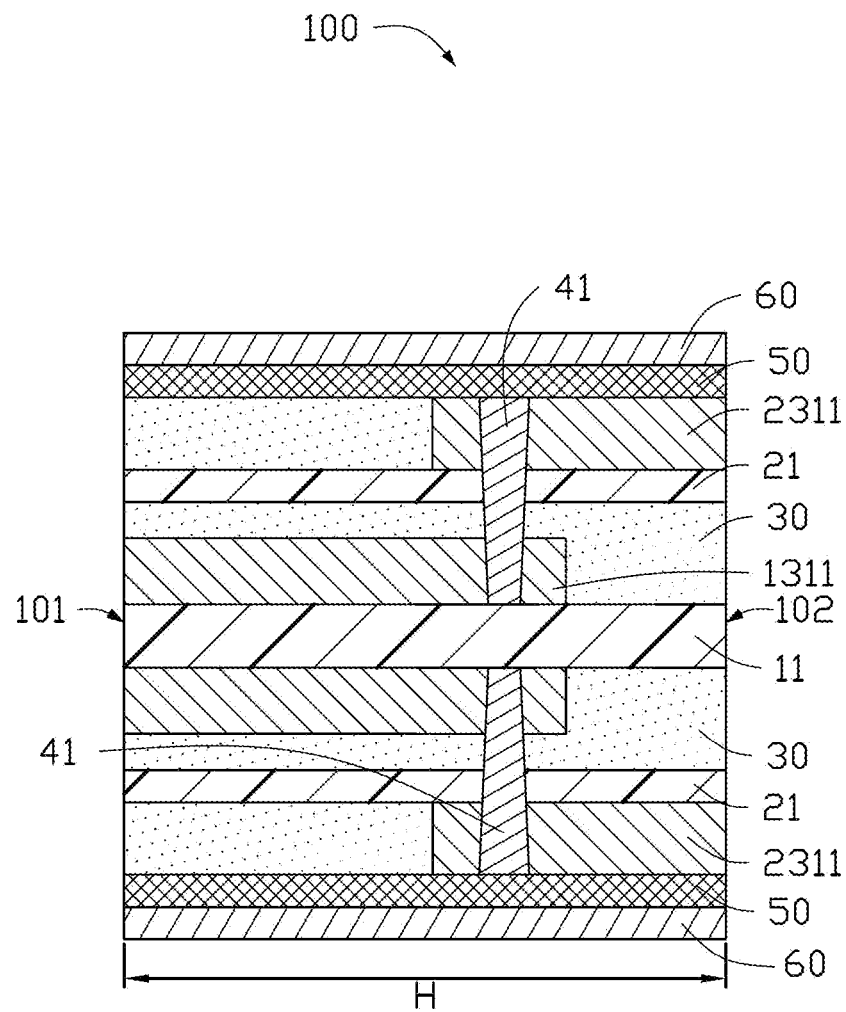
FIG. 12 is a cross-sectional view of another region of the interposer of FIG. 10.
Figure 13:
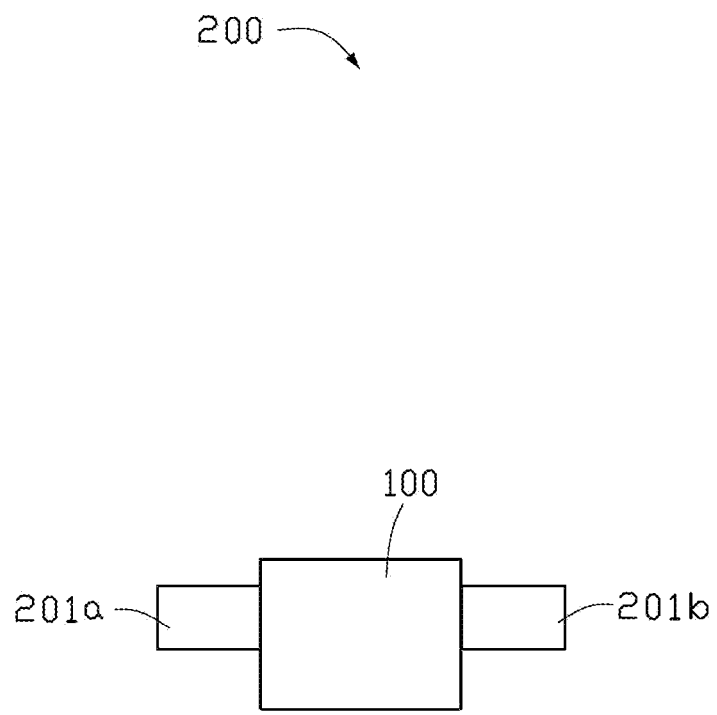
FIG. 13 is cross-sectional view of a circuit board assembly according to an embodiment of the present disclosure.

Preferably, referring to FIG. 12, the interposer 100 includes a sidewall 101 and an opposite sidewall 102. The connecting pad formed by the wiring line 2311 of the second wiring layer 231 is located on the sidewall 102. The connecting pad formed by the wiring line 1311 of the first wiring layer 131 is located on the sidewall 101. The conductive blind hole 41 passes through the second base layer 21 and the adhesive layer 30. One end portion of the conductive blind hole 41 is connected to one end portion of the wiring line 2311 of the second wiring layer 231 that does not extend to the sidewall 101 of the interposer 100. The other end portion of the conductive blind hole 41 is connected to one end portion of the wiring line 1311 of the first wiring layer 131 that does not extend to the sidewall 102 of the interposer 100. As such, the distribution density of the connecting pads on the sidewall 102 is less than that of the connecting pads on the sidewall 101.

The asymmetric structure can improve the flexibility of the interposer 100 in use. When the required connection positions of the two circuit boards or components do not correspond to each other one by one, the asymmetric conduction structure is needed to connect such two circuit boards or components. When the two sides of the interposer 100 need to be connected to two circuit boards or components of different sizes, the conduction structure with different distribution density of the connecting pads on the two sidewalls is required.

The protective layer 50 covers the second wiring layer 231. The reinforcing plate 60 covers the protective layer 50. In some embodiments, the reinforcing plate 60 may also be omitted.

In this embodiment, the two sidewalls of the interposer 100 are used to connect the corresponding circuit boards, which are not limited. In other embodiments, the interposer 100 may also be used to connect various electronic components.

A circuit board assembly 200 is also provided according to another embodiment of the present disclosure. The circuit board assembly 200 includes at least two circuit boards 201a, 201b and an interposer 100. The interposer 100 is located between the two circuit boards 201a, 201b for electrically connecting the two circuit boards 201a, 201b to each other. The interposer 100 includes two sidewalls each for connecting one corresponding circuit board 201a/201b. Referring to FIGS. 9 to 11, the interposer 100 includes a plurality of base layers and wiring lines formed between two adjacent base layers.

The wiring lines are used for electrically connecting the two circuit boards 201a, 201b to each other. Two end portions of a portion of the wiring lines extend to the two sidewalls of the interposer 100. One end portion of such wiring line is connected to one circuit board 201a, and the other one end portion is connected to another circuit board 201b. Only one end of another portion of the wiring lines extends to the sidewall of the interposer 100. The interposer 100 also includes a conductive blind hole 41 electrically connecting two wiring lines at different wiring layers. One end portion of one of the two wiring lines is connected to one circuit board 201a, and one end portion of the other one of the two wiring lines is connected to another circuit board 201b. The path between the two spaced wiring lines can also include other wiring line whose two end portions extend to the sidewalls of the interposer 100, and both end portions of such wiring line are connected to the conductive blind hole 41.

The present disclosure is illustrative only, and changes may be made in the details, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. An interposer, comprising a first sidewall and a second sidewall opposite to the first sidewall, the interposer further comprising:
   an inner structure comprising a first base layer and a first wiring layer formed on the first base layer;
   at least one outer structure each comprising a second base layer and a second wiring layer formed on the second base layer, wherein wiring lines of the first wiring layer or the second wiring layer comprise a first wiring line, an end portion of the first wiring line extends to the first sidewall, the wiring lines of the first wiring layer or the second wiring layer further comprise a second wiring line, an end portion of the second wiring line extends to the second sidewall, the end portion of the first wiring line or the second wiring line extending to the corresponding first or second sidewall functions as a connecting pad;
   an adhesive layer bonding the second base layer on the first wiring layer;
   at least one conductive blind hole at least passing through the adhesive layer and the second base layer, wherein an end portion of the at least one conductive blind hole is connected to another end portion of the first wiring line that does not extend to the first sidewall, and another end portion of the at least one conductive blind hole is connected to another end portion of the second wiring line that does not extend to the second sidewall, thereby forming a path from one side of the interposer to the other side; and
   a protective layer covering the second wiring layer,
   wherein the first wiring layer is formed on each of two opposite surfaces of the first base layer, the at least one outer structure comprises at least two outer structures, each of the at least two outer structures covers the first wiring layer.

2. The interposer according to claim 1, wherein the wiring lines of the first wiring layer or the second wiring layer further comprise a third wiring line, two end portions of the third wiring line extend to the first sidewall and the second sidewall, respectively.

3. The interposer according to claim 2, wherein the wiring lines of the first wiring layer or the second wiring layer further comprise a fourth wiring line, two end portions of the fourth wiring line do not extend to the first sidewall and the second sidewall.

4. The interposer according to claim 2, wherein a spacing between adjacent two of the wiring lines of the first wiring layer is greater than 0.25 mm and less than or equal to 0.635 mm, and a spacing between adjacent two of the wiring lines of the second wiring layer is greater than 0.25 mm and less than or equal to 0.635 mm.

5. The interposer according to claim 1, wherein each of the first base layer and the second base layer is made of a material selected from a group consisting of polyimide, polypropylene, liquid crystal polymer, polyether-ether-ketone, polyethylene terephthalate, and polyethylene naphthalate.

6. The interposer according to claim 1, further comprising a reinforcing plate covering the protective layer.

7. The interposer according to claim 1, wherein a thickness of the first base layer is greater than a thickness of the second base layer.

8. The circuit board assembly according to claim 1, wherein each of the plurality of base layers is made of a material selected from a group consisting of polyimide, polypropylene, liquid crystal polymer, polyether-ether-ketone, polyethylene terephthalate, and polyethylene naphthalate.

9. A manufacturing method of an interposer, comprising:
forming a first wiring layer on a first base layer;
pressing a second base layer on the first wiring layer through an adhesive layer;
forming a second wiring layer on a surface of the second base layer away from the first wiring layer;
defining a blind hole, wherein the blind hole passes through the second wiring layer, the second base layer, the adhesive layer, the first wiring layer, and the first base layer;
electroplating in the blind hole to form a conductive blind hole;
covering a protective layer on the second wiring layer to obtain the interposer, wherein the interposer comprises a first sidewall and a second sidewall opposite to the first sidewall; wiring lines of the first wiring layer or the second wiring layer comprise a first wiring line, an end portion of the first wiring line extends to the first sidewall, an end portion of the conductive blind hole is connected to another end portion of the first wiring line that does not extend to the first sidewall;
the wiring lines of the first wiring layer or the second wiring layer further comprise a second wiring line, an end portion of the second wiring line extends to the second sidewall, another end portion of the conductive blind hole is connected to another end portion of the second wiring line that does not extend to the second sidewall-,
wherein the wiring lines of the first wiring layer or the second wiring layer further comprise a third wiring line, two end portions of the third wiring line extend to the first sidewall and the second sidewall, respectively.

10. The manufacturing method of the interposer according to claim 9, wherein the wiring lines of the first wiring layer or the second wiring layer further comprise a fourth wiring line, two end portions of the fourth wiring line do not extend to the first sidewall and the second sidewall.

11. The manufacturing method of the interposer according to claim 9, further comprising:
covering a reinforcing plate on the protective layer.

12. A circuit board assembly, comprising:
two circuit boards; and
an interposer disposed between the two circuit boards, the interposer comprising a first sidewall and a second sidewall opposite to the first sidewall,
wherein the interposer comprises a plurality of base layers and wiring lines disposed between adjacent two of the plurality of base layers;
the interposer further comprises a conductive blind hole for connecting two of the wiring lines at different layers;
an end portion of one of the two wiring lines is connected to one of the two circuit boards, and an end portion of the other one of the two wiring lines is connected to the other one of the two circuit boards,
wherein the wiring lines further comprise a third wiring line, two end portions of the third wiring line extend to the first sidewall and the second sidewall, respectively,
wherein the wiring lines further comprise a fourth wiring line, two end portions of the fourth wiring line do not extend to the first sidewall and the second sidewall.

13. The circuit board assembly according to claim 12, wherein a spacing between adjacent two of the wiring lines at a same layer is greater than 0.25 mm and less than or equal to 0.635 mm.

14. The circuit board assembly according to claim 12, wherein the interposer further comprises a protective layer covering the wiring lines.

* * * * *